United States Patent
Horng et al.

(10) Patent No.: US 6,466,418 B1
(45) Date of Patent: Oct. 15, 2002

(54) BOTTOM SPIN VALVES WITH CONTINUOUS SPACER EXCHANGE (OR HARD) BIAS

(75) Inventors: Cheng T. Horng, San Jose; Min Li; Simon H. Liao, both of Fremont; Ru-Ying Tong, San Jose; Chyu Jiuh Torng, Pleasanton; Rongfu Xiao, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/502,035

(22) Filed: Feb. 11, 2000

(51) Int. Cl.[7] .............................. G11B 5/39; H04R 31/00
(52) U.S. Cl. ................................ 360/324.12; 29/603.14
(58) Field of Search ........................... 360/324.12, 324, 360/324.1; 29/603.14, 603.15

(56) References Cited

U.S. PATENT DOCUMENTS

| | | | |
|---|---|---|---|
| 5,701,223 A | 12/1997 | Fontana, Jr. et al. | 360/113 |
| 5,883,764 A | 3/1999 | Pinarbasi | 360/113 |
| 5,896,252 A | 4/1999 | Kanai | 360/113 |
| 5,919,580 A | 7/1999 | Barnard et al. | 428/692 |
| 6,268,985 B1 * | 7/2001 | Pinarbasi | 360/324.12 |
| 6,348,274 B1 * | 2/2002 | Kamiguchi et al. | 428/692 |

FOREIGN PATENT DOCUMENTS

| JP | 2000057528 A | * 2/2000 | ............ G11B/5/39 |
| JP | 2001291915 A | * 10/2001 | ........... H01L/43/08 |

OTHER PUBLICATIONS

Kamiguchi et al., "CoFe Specular Spin Valves with a Nano Oxide Layer", a Paper Presented at the 1999 Intermag Conference.

* cited by examiner

*Primary Examiner*—William Klimowicz
(74) *Attorney, Agent, or Firm*—George O. Saile; Stephen B. Ackerman

(57) ABSTRACT

A method for forming a specularly reflecting bottom spin valve magnetoresistive (SVMR) sensor element with continuous spacer exchange hard bias and a specularly reflecting bottom spin valve magnetoresistive (SVMR) sensor element fabricated according to that method. To practice the method, there is provided a substrate upon which is formed a seed layer, upon which is formed an antiferromagnetic pinning layer, upon which is formed a ferromagnetic pinned layer, upon which is formed a non-magnetic spacer layer, upon which is formed a ferromagnetic free layer, upon which is formed a specularly reflecting and capping layer. The width of the sensor element is defined by a pair of conducting leads aligned upon a pair of continuous spacer exchange hard bias layers.

37 Claims, 2 Drawing Sheets

FIG. 1 - Prior Art

BOTTOM SPIN VALVES WITH CONTINUOUS SPACER EXCHANGE (OR HARD) BIAS

RELATED PATENT APPLICATION

This application is related to Docket No. HT 98-030, Ser. No. 09/236488, filing date Jan. 25, 1999, now abandoned, assigned to the same assignee as the current invention.

BACKGROUND OF THE INVENTION

1. Field of the Invention

This invention relates generally to the fabrication of a giant magnetoresistive (GMR) magnetic field sensor in a magnetic read head, more specifically to a spin valve type of GMR sensor of the bottom spin valve type.

2. Description of the Related Art

Early forms of magnetic read heads decoded magnetically stored data on media such as disks and tapes by making use of the anisotropic magnetoresistive effect (AMR) in magnetic materials such as permalloy. This effect was the change in the electrical resistance, r, of certain magnetic materials in proportion to the angle between the direction of their magnetization and the direction of the current flow through them. Since changing magnetic fields of moving magnetized media, such as magnetically encoded tapes and disks, will change the direction of the magnetization in a read head, the resistance variations of the AMR effect allows the information on such encoded media to be sensed and interpreted by appropriate circuitry.

One shortcoming of the AMR effect was the fact that it produced a maximum fractional resistance change, Dr/r (where Dr is the change in resistance between the magnetic material subjected to its anisotropy field, $H_k$, and the material subjected to zero field), which was only on the order of a few percent. This made the sensing process difficult to achieve with accuracy.

In the late 1980's and early 1990's the phenomenon of giant magnetoresistance (GMR) was discovered and soon applied to read head technology. The GMR effect derives from the fact that thin ($\equiv 20$ angstroms) layers of ferromagnetic materials, when separated by even thinner ($\equiv 10$ angstroms) layers of conductive but non-magnetic materials, will acquire ferromagnetic (parallel spin direction of the layers) or antiferromagnetic states (antiparallel spin direction of the layers) by means of exchange interactions between the spins. As a result of spin dependent electron scattering as electrons crossed the layers, the magnetoresistance of such layered structures was found to be significantly higher in the antiferromagnetic state than the ferromagnetic state and the fractional change in resistance was much higher than that found in the AMR of individual magnetic layers.

Shortly thereafter a version of the GMR effect called spin valve magnetoresistance (SVMR) was discovered and implemented. In the SVMR version of GMR, two ferromagnetic layers such as CoFe or NiFe are separated by a thin layer of electrically conducting but non-magnetic material such as Cu. One of the layers has its magnetization direction fixed in space or "pinned," by exchange anisotropy from an antiferromagnetic layer directly deposited upon it. The remaining ferromagnetic layer, the unpinned or free layer, can respond to small variations in external magnetic fields such as are produced by moving magnetic media, (which do not affect the magnetization direction of the pinned layer), by rotating its magnetization direction. This rotation of one magnetization relative to the other then produces changes in the magnetoresistance of the three layer structure.

The spin valve structure has now become the implementation of choice in the fabrication of magnetic read head assemblies. The trend in recent patents has been to improve the sensitivity and stability of these spin valves by novel choices of the materials used to form their various ferromagnetic and antiferromagnetic layers, by variations in the number and dimensions of such layers and by choices of the structure and composition of the leads connecting the spin valve to the external circuitry. In this connection, Kanai (U.S. Pat. No. 5,896,252) teaches a method for constructing a spin valve magnetoresistive (SVMR) head element in which the free (unpinned) magnetic layer is manufactured in a two-layer structure composed of a CoFe layer and an NiFe layer. Barnard et al. (U.S. Pat. No. 5,919,580) teach a method of forming a spin valve device (SVMR) whose antiferromagnetic pinning layer is chromium rich and has a tunable Neel temperature and anisotropy constant. Fontana, Jr. et al. (U.S. Pat. No. 5,701,223) teaches a method of constructing a SVMR sensor that uses a laminated antiparallel (AP) pinned layer in combination with an improved antiferromagnetic (AF) layer. Pinarbasi (U.S. Pat. No. 5,883,764) teaches a method of providing an SVMR structure with a very thin and highly conductive lead structure.

Improvements in the design and fabrication of SVMR read heads must now be directed towards their use in decoding hard disks whose magnetic information content is approaching a density of 20 gigabytes per square inch (20 $Gb/in^2$). As presently fabricated, SVMR sensors are adequate for densities on the order of a few gigabytes per square inch, but they lack the physical properties necessary to accurately decode the increased density. Kamiguchi et al., in "CoFe Specular Spin Valves With A Nano Oxide Layer," a paper presented at the 1999 Intermag Conference, outline a method of forming a spin valve structure with an enhanced GMR ratio. Their structure makes use of a CoFeO/TaO specularly reflecting layer, a CoFe free layer and an IrMn antiferromagnetic layer. It is the aim of the present invention to also address the problem of fabricating an SVMR read head that is capable of decoding ultra-high densities of magnetically encoded information.

SUMMARY OF THE INVENTION

A first object of this invention is to provide a method for forming a magnetoresistive (MR) sensor element whose operation is based upon the giant magnetoresitive properties of certain magnetic structures, along with the magnetoresistive (MR) sensor element whose operation is so based.

A second object of this invention is to provide a method for forming a magnetoresistive (MR) sensor element which is capable of and suitable for decoding ultra-high density (20 $Gb/in^2$) magnetic recordings, along with the magnetoresistive (MR) sensor element having said capability and suitability.

In accord with the objects of this invention there is provided a spin valve magnetoresistive (SVMR) sensor and a method for its fabrication. Said spin valve magnetoresistive (SVMR) sensor is of the bottom spin valve structure, which provides advantages in the reading of ultra-high density magnetic data over the more common top spin valve structure. Further in accord with the objects of this invention, said bottom spin valve structure of the present invention is fabricated so as to employ and embody the advantages resulting from the specular reflection of conduction electrons from certain material layers of the spin valve structure. Such specular reflection, when acting in concert with the spin dependent scattering of the GMR effect, produces further enhancements of the magnetoresistance ratio, Dr/r. Still further in accord with the objects of this invention, said specular reflecting, bottom spin valve structure comprises a CoFe-NiFe free layer and a TaO/NiCr specular reflection layer, which combination of layers and materials is experimentally found to produce a high output voltage, provide free-layer anisotropic properties that are superior to other ferromagnetic materials such as CoFe, provide a thermally more stable sensor element and thereby be the most suitable materials for satisfying the objects of the present invention. Finally, in accord with the objects of said invention said specular reflecting, bottom spin valve sensor is longitudinally hard-biased to maintain the proper magnetization orientation of the free ferromagnetic layer, using a continuous spacer exchange hard-bias structure which thereby eliminates the "dead zone" of the top-valve SVMR structure, which elimination is essential for the decoding of the narrow tracks in ultra-high density applications.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying figures, wherein.

DESCRIPTION OF THE PREFERRED EMBODIMENT

The present invention provides a magnetoresistive (MR) sensor element, more specifically an MR element utilizing the giant magnetoresistive (GMR) effect, implemented in the form of a spin valve magnetoresistive (SVMR) sensor of the bottom spin valve type and a method for forming said sensor element. Further, said bottom SVMR sensor comprises a configuration of material layers whose sequence, composition and thicknesses are empirically determined to produce an enhanced magnetoresistance ratio (Dr/r), where Dr is the maximum resistance variation, through the specular reflection of conduction electrons. An MR sensor junction is defined on said configuration of material layers by a pair of continuous spacer exchange (or hard) bias layers, producing, thereby, an MR sensor element which is most suitable for the decoding of ultra-high density magnetically stored information.

Figure 1:
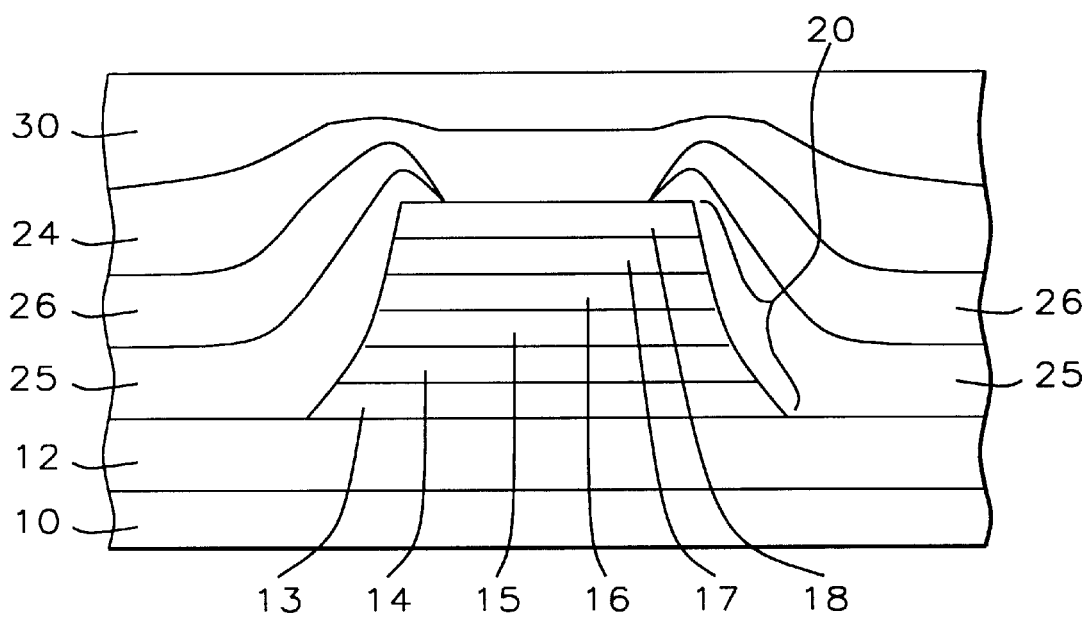
FIG. 1 shows a schematic diagram of the air bearing surface (ABS) of a typical top spin valve magnetoresistive (SVMR) sensor fashioned in accord with the methods of the present art but not in accord with the methods of the present invention. Said figure is to be viewed for purposes of comparison with the present invention, according to the diagram depicted in the following figure.

Referring now to FIG. 1, there is shown, for comparison purposes only, a schematic diagram of the air bearing surface (ABS) of a typical top SVMR as would be fabricated according to the methods of the present art. Said top SVMR is positioned between the bottom shield (10) and top shield (30) of the read/write head structure, which region defines the read-gap of the head. The top SVMR stack is a multilayered structure (20) whose total thickness is approximately 400 angstroms. It is formed between a lower substrate (12), composed of aluminum oxide, whose thickness is approximately 570 angstroms, and an upper substrate (24), composed of aluminum oxide, whose thickness is approximately 330 angstroms.

The top SVMR multilayered stack (20) comprises a first material layer (13) which in this example is a Ta seed layer, upon which is formed a second material layer (14) which is the ferromagnetic free layer and which in this example is a layer of NiFe-CoFe. Upon this free layer is formed a non-magnetic spacer layer (15), which in this example is a Cu layer. Upon the spacer layer is formed a ferromagnetic pinned layer (16), which in this example is a CoFe layer. Upon the pinned layer is formed an antiferromagnetic pinning layer (17) which can be a layer of any one of a number of antiferromagnetic materials, of which MnPt is a particularly appropriate choice because of its excellent thermal stability.

Upon the AFM pinning layer is formed a capping layer, which in this example is a Ta layer, to complete the SVMR stack. As can be seen from the drawing, the pinned layer (16) is at the top side of the SVMR stack and the free layer (14) is at its bottom side. Moreover, the free layer is situated at the center of the read gap, between the bottom shield (10) and the top shield (30). For a read gap of total thickness, from shield to shield, of 0.13 microns, with a 400 angstrom thick SVMR stack, the lower substrate (12) is 570 angstroms thick and the upper substrate (24) is 330 angstroms thick. From device topographic and yield points of view, the width of the sensor track is best defined by a pair of patterned, contiguous (abutting) hard bias layers (25) formed of a hard ferromagnetic (permanent magnet) material such as CoPtCr, aligned upon a pair of electrical lead layers (26). It is to be noted that this method of defining the width of the sensor track leads to the formation of a "dead zone" (a region at the junction of the hard bias layer and SVMR stack where the magnetization runs parallel to the junction edge), making the top SVMR structure less suitable for decoding of ultra-high area density magnetic information.

The magnetoresistive ratio (Dr/r) and signal amplitude (Dr) of the top SVMR can be enhanced by forming the first material seed layer (13) from NiFeCr or NiCr, rather than Ta. The use of a NiFeCr or NiCr seed layer produces specular reflection of the conduction electrons in the top SVMR, to which the enhancements can be attributed. In addition, the thermal stability (hence reliability) of the NiFeCr or NiCr based SVMR structure is better than that of the Ta based SVMR structure.

Figure 2:
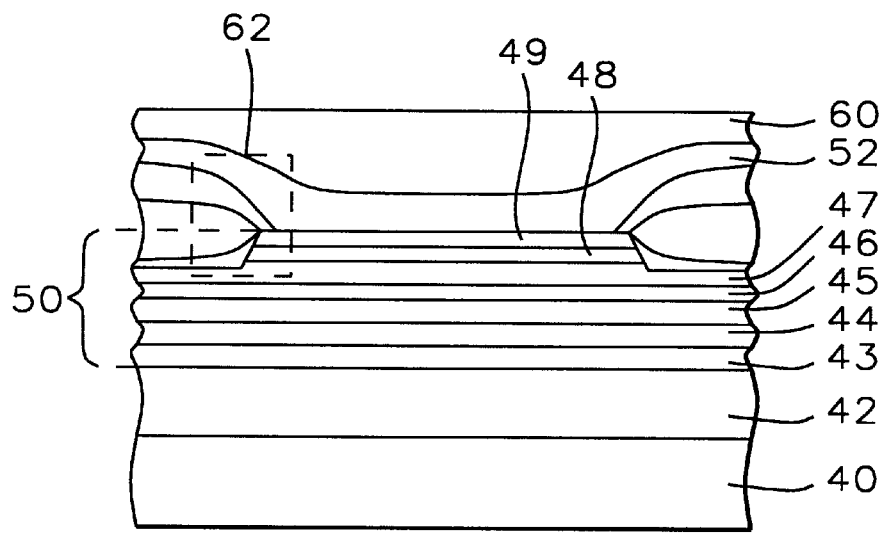
FIG. 2 shows a schematic diagram of the air bearing surface (ABS) of a specularly reflecting, continuous exchange-biased bottom spin valve magnetoresistive (SVMR) sensor structure fashioned in accord with the methods of the present invention.

Referring now to FIG. 2, there is shown a schematic drawing of the air-bearing surface (ABS) of a specularly reflecting, continuous spacer exchanged-biased bottom SVMR fabricated according to the methods of the present invention. Said bottom SVMR is positioned between the bottom shield (40) and top shield (60) of the read/write head structure, which region between the shields defines the read-gap of the head. The bottom valve SVMR stack is a multilayered structure (50) whose total thickness is approximately 380 angstroms. It is formed between a lower substrate (42), composed of aluminum oxide, whose thickness is approximately 330 angstroms, and an upper substrate (52), composed of aluminum oxide whose thickness is approximately 590 angstroms.

The bottom SVMR multilayered stack (50) comprises a first material layer (43) which in this embodiment is a MR enhancing seed layer of NiCr (which could also be NiFeCr), 55 angstroms thick, but which can be of thickness between 45 angstroms and 65 angstroms. Upon this seed layer is formed a second material layer (44) which is an antiferromagnetic pinning layer composed of MnPt, 200 angstroms thick but which can be of thickness between 150 angstroms and 250 angstroms. Upon this pinning layer is formed a third material layer (45) which is a ferromagnetic pinned layer consisting of CoFe, 20 angstroms thick, but which can be of thickness between 15 angstroms and 25 angstroms. Upon this pinned layer is formed a fourth material layer, which is a non-magnetic Cu spacer layer (46), of thickness between 20 angstroms and 22 angstroms. Upon the spacer layer is formed a fifth material layer (47) which is a ferromagnetic free layer consisting of a very thin layer of CoFe, of thickness less than 5 angstroms, on which is formed a layer consisting of NiFe of thickness between 30 angstroms and 60 angstroms, which ferromagnetically couples to said CoFe layer.

Upon this ferromagnetically coupled free layer is formed a sixth material layer (48), which is a layer of Ta of thickness 5 angstroms, which is then oxidized to form a layer of TaO by means of a plasma ashing process performed in the substrate cleaning module. Upon that layer is then formed a seventh material layer (49), which is a capping layer of NiCr of thickness 20 angstroms, but which can be of thickness between 10 angstroms and 30 angstroms. The NiCr capping layer is preferred to Ta, since the NiCr prevents further oxidation in the stack during the high temperature field annealing (280° C. for 5 hours) used to set the magnetization of the pinned layer into a transverse direction. It is found, in this regard, that a NiCr layer 10 angstroms thick is sufficient as an oxidation barrier. Layers (48) and (49) provide the mechanism by which the specular reflection of conduction electrons is achieved thereby enhancing the magnetoresistance ratio of the giant magnetoresistance property of the bottom SVMR.

The width of the SVMR sensor junction defines the track width of the read head structure. Said width is delineated by the formation of a pair of conducting leads and a pair of patterned longitudinal biasing layers, separated in the present embodiment by less than 1.0 microns, one set of which are shown boxed in (62). The conducting leads connect the SVMR sensing junction to the external circuitry, enabling the resistance variations of the SVMR to be converted into electrical signals, the longitudinal biasing layers providing a bias for the magnetization direction of the free ferromagnetic layer, which is parallel to the plane of the air-bearing surface (ABS).

Figure 3:
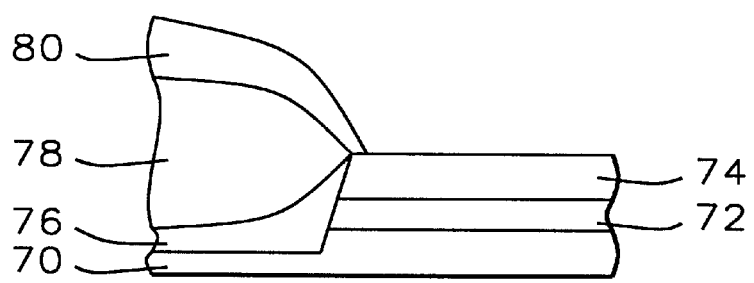
FIG. 3 shows an enlarged view of the region of said SVMR structure depicted in FIG. 2 in which the conducting leads and continuous spacer exchange horizontal hard bias layer are connected to said structure.

Referring now to FIG. 3, there is shown a more detailed schematic drawing of a conduction lead layer and hard bias layer shown in (62) of FIG. 2. To implement the specularly reflecting, bottom SVMR of the present invention as an operational read head in accord with the objects of the present invention, the longitudinal biasing of the SVMR sensor is accomplished using a continuous spacer exchange (hard) bias layer aligned upon the conduction lead layer. To practice the method of the present invention, the SVMR stack (shown as (50) in FIG. 2) is first provided a lift-off resist pattern. The exposed area of the pattern is IBE (or sputter etched) to completely remove the NiCr/TaO layer (shown as (49)/(48) in FIG. 2 and as (74)/(72) in the present figure) as well as a portion of the NiFe free ferromagnetic layer (70). The resulting etched region is then refilled by a deposition of NiFe. Following this, an antiferromagnetic material (e.g. MnNi, MnPt or IrMn) or a hard magnetic material (e.g. CoPt or CoPtCr) is deposited over the NiFe to serve, together, as the longitudinal exchange bias layer. The thickness of the hard bias layer must be determined by the magnetic moment of the free layer. Finally, the conducting leads, formed of a sequential deposition of materials such as Ta (50–100 angstroms)/Au (400–500 angstroms)/Ta (50–100 angstroms), are aligned and deposited on the biasing layer.

Determining the optimal sequence of materials and their thicknesses for the fabrication of a SVMR that meets the objects of the present invention was the goal of a series of experimental investigations that will be briefly outlined herein. In accord with that goal, five SVMR stacks were fabricated and tested for such magnetic properties as saturation magnetization ($B_s$), free layer coercivity ($H_c$), interlayer coupling ($H_e$), anisotropy field ($H_k$), sheet resistance ($R_s$), magnetoresistance ratio (Dr/r) and output amplitude (Dr). The magnetic moment of all free layers, at the deposition step, is equivalent to a 38 angstrom NiFe layer. The results of these investigations is summarized in the following table.

| Structure | $B_s$ | $H_c$ | $H_e$ | $H_k$ | $R_s$ | Dr/r | Dr |
|---|---|---|---|---|---|---|---|
| 1 CZB55/MP200/CoFe20/Cu30/CoFe20/CZB50 | 0.21 | 2.80 | 56.9 | 20.4 | 15.3 | 6.75 | 1.06 |
| 2 CZB55/MP200/CoFe20/Cu30/CoFe20/OL/CZB50 | 0.12 | 4.01 | 75.7 | 19.4 | 16.6 | 7.38 | 1.23 |
| 3 CZB55/MP200/CoFe20/Cu30/CoFe20/Ta5/OL/CZB50 | 0.18 | 7.66 | 4.9 | 10.4 | 15.3 | 8.00 | 1.22 |
| 4 CZB55/MP200/CoFe20/Cu30/CoFe3/NiFe32.5/Ta5/OL/Al$_2$O$_3$40 | 0.24 | 9.43 | 6.0 | 10.6 | 14.4 | 8.43 | 1.21 |
| 5 CZB55/MP200/CoFe20/Cu20/CoFe3/NiFe32.5/Ta5/OL/CZB30 | 0.24 | 6.06 | 6.4 | 5.4 | 18.4 | 9.32 | 1.72 |

In the table above, MP200 refers to 200 angstroms of MnPt, OL means that the previous layer was oxidized by plasma ashing and CZB refers to NiCr. The H fields are measured in Oersteds, the B fields are measured in nanowebers/cm$^2$ and the resistances are measured in ohms/cm$^2$)

Stack 1 represents a "simple" bottom SVMR stack and can be used for comparison purposes. Stack 2 shows that the plasma ashing must have oxidized a good portion of the CoFe free layer to form CoFeO. CoFeO promotes specular reflection, which is evidenced by the increase in the value of Dr/r. The interlayer coupling field (He) for both stacks was very high. To reduce CoFe oxidation in stack 3, a thin (5 angstroms) TaO film was deposited prior to plasma..ashing. In this case a CoFeO/TaO specular reflection layer is formed. A drastic enhancement of the Dr/r ratio and output (Dr) is obtained in the structure of stack 5 in which TaO is formed on the NiFe free layer. This NiFe/TaO spin valve stack also exhibits softer free layer magnetic properties, i.e. lower $H_e$ and $H_k$.

To see if the specular reflection effect is a result of the TaO layer alone or of the TaO/NiCr combination, the spin valve structure of stack 4 was formed, in which the final capping layer is 40 angstroms of $Al_{2O3}$ rather than NiCr. In stack 4 the Dr/r ratio is 8.43%, approximately 1% point lower than the 9.32% of stack 5. To obtain an equivalent value of $H_e$, the thickness of the Cu spacer layer in stacks 3 and 4 must be 30 angstroms, compared to 20 a angstrom spacer thickness of stack 5. Thus we conclude that TaO/NiCr is a better specular reflection layer for the NiFe spin valve structure. It should be noted that MnPt has been the antiferromagnetic material of choice in all these stacks because it has better thermal stability (reliability) than substances such as IrMn, which is used in the work of Kamiguchi et al., cited above. In addition, the spin valve structures of the present invention, using CoFe-NiFe as the material for the ferromagnetic free layer, have superior anisotropic properties to structures using only CoFe as the free layer material (as in the work of Kamiguchi et al., cited above), which latter choice can lead to sensor instability problems. As a result of this sequence of stack comparisons, we are led to the stack configuration that constitutes the preferred embodiment of this invention and is illustrated in FIG. 2 as discussed above.

As is understood by a person skilled in the art, the preferred embodiment of the present invention is illustrative of the present invention rather than limiting of the present invention. Revisions and modifications may be made to methods, materials, structures and dimensions employed in fabricating a specularly reflecting, bottom SVMR sensor with continuous spacer exchange hard bias as well as to the materials and structures comprising said specularly reflecting, bottom SVMR sensor with continuous spacer exchange hard bias fabricated in accord with the preferred embodiment of the present invention, while still providing :a method for fabricating such a specularly reflecting, bottom SVMR sensor with continuous spacer exchange hard bias and a specularly reflecting, bottom SVMR sensor with continuous spacer exchange hard bias so fabricated, in accord with the spirit and scope of the present invention as defined by the appended claims.

What is claimed is:

1. A method for forming a specularly reflecting bottom spin valve magnetoresistive (SVMR) sensor element with continuous spacer exchange hard bias comprising:

providing a substrate;

forming over said substrate a seed layer;

forming over said seed layer an antiferromagnetic pinning layer;

forming over said antiferromagnetic pinning layer a ferromagnetic pinned layer;

forming over said ferromagnetic pinned layer a non-magnetic spacer layer;

forming over said non-magnetic spacer layer a ferromagnetic free layer;

forming over said ferromagnetic free layer a Ta layer;

oxidizing said Ta layer;

forming over said oxidized Ta layer a capping layer;

forming over said capping layer a lift-off resist pattern;

removing the developed areas of said resist pattern to expose a portion of the capping layer;

removing said exposed portion of the capping layer, together with the oxidized Ta layer and part of the ferromagnetic free layer beneath said exposed portion;

refilling the removed region with a ferromagnetic layer;

forming over said ferromagnetic layer a longitudinally biasing layer;

forming over said longitudinally biasing layer a conductor lead layer;

forming over said conductor lead layer and the remaining portion of the capping layer an upper substrate layer.

2. The method of claim 1 wherein the substrate is composed of aluminum oxide of thickness between 250 angstroms and 350 angstroms.

3. The method of claim 1 wherein the seed layer is a NiCr layer of thickness between 45 angstroms and 65 angstroms.

4. The method of claim 1 wherein the antiferromagnetic pinning layer is a layer of MnPt of thickness between 150 angstroms and 250 angstroms.

5. The method of claim 1 wherein the ferromagnetic pinned layer is a layer of CoFe of thickness between 15 angstroms and 25 angstroms.

6. The method of claim 1 wherein the non-magnetic spacer layer is a layer of Cu of thickness between 18 angstroms and 25 angstroms.

7. The method of claim 1 wherein the ferromagnetic free layer is a double layer consisting of a layer of CoFe of thickness less than 5 angstroms on which is formed a layer of NiFe of thickness between 30 angstroms and 60 angstroms.

8. The method of claim 1 wherein the Ta layer is of thickness less than 5 angstroms.

9. The method of claim 1 wherein the layer of Ta is oxidized by a process of plasma ashing to form, thereby, a layer of TaO.

10. The method of claim 9 wherein the plasma ashing is carried out in a substrate cleaning module.

11. The method of claim 1 wherein the capping layer is a layer of NiCr of thickness between 10 angstroms and 30 angstroms.

12. The method of claim 1 wherein the exposed region of the capping layer is IBE or sputter-etched to completely remove said exposed region and to completely remove a corresponding region of the oxidized Ta layer beneath said exposed region of the capping layer and to partially remove a corresponding region of the ferromagnetic free layer beneath the removed region of said oxidized Ta layer.

13. The method of claim 1 wherein the ferromagnetic layer that refills the etched-out region is a layer of NiFe.

14. The method of claim 1 wherein the longitudinally biasing layer that is formed over the ferromagnetic layer is a layer of the antiferromagnetic material MnNi.

15. The method of claim 1 wherein the longitudinally biasing layer that is formed over the ferromagnetic layer is a layer of the antiferromagnetic material MnPt.

16. The method of claim 1 wherein the longitudinally biasing layer that is formed over the ferromagnetic layer is a layer of the antiferromagnetic material IrMn.

17. The method of claim 1 wherein the longitudinally biasing layer that is formed over the ferromagnetic layer is a layer of the hard magnetic material CoPt.

18. The method of claim 1 wherein the longitudinally biasing layer that is formed over the ferromagnetic layer is a layer of the hard magnetic material CoPtCr.

19. The method of claim 1 wherein the conductor lead layer is a layer of Ta (50–100 angstroms)/Au (400–500 angstroms)/Ta (50–100 angstroms) which is aligned and deposited on the longitudinally biasing layer.

20. The method of claim 1 wherein the upper substrate layer is layer of aluminum oxide deposited to a thickness of between 350 angstroms and 500 angstroms.

21. A bottom valve, specularly reflecting spin valve magnetoresistive (SVMR) sensor element with continuous spacer exchange hard bias comprising:

a substrate;

a seed layer formed over said substrate;

an antiferromagnetic pinning layer formed over said seed layer;

a ferromagnetic pinned layer formed over said antiferromagnetic pinning layer;

a non-magnetic spacer layer formed over said ferromagnetic pinned layer;

a ferromagnetic free layer formed over said non-magnetic spacer layer;

a layer of TaO formed over said ferromagnetic free layer;

a capping layer formed over said TaO layer;

an etched out region that is refilled with a ferromagnetic layer;

a longitudinally biasing layer that is formed over said ferromagnetic layer;

a conductor lead layer that is formed over said longitudinally biasing layer;

an upper substrate layer that is formed over the conductor lead layer and the remaining portion of said capping layer.

22. The structure of claim 21 wherein the substrate is composed of aluminum oxide of thickness between 250 angstroms and 350 angstroms.

23. The structure of claim 21 wherein the seed layer is a NiCr seed layer of thickness between 45 angstroms and 65 angstroms.

24. The structure of claim 21 wherein the antiferromagnetic pinning layer is a layer of MnPt of thickness between 150 angstroms and 250 angstroms.

25. The structure of claim 21 wherein the ferromagnetic pinned layer is a layer of CoFe of thickness between 15 angstroms and 25 angstroms.

26. The structure of claim 21 wherein the non-magnetic spacer layer is a layer of Cu of thickness between 18 angstroms and 25 angstroms.

27. The structure of claim 21 wherein the ferromagnetic free layer is a layer consisting of a layer of CoFe of thickness less than 5 angstroms on which is formed a layer of NiFe of thickness between 30 angstroms and 60 angstroms.

28. The structure of claim 21 wherein the layer of TaO is of thickness less than 10 angstroms.

29. The structure of claim 21 wherein the capping layer is a layer of NiCr of thickness between 10 angstroms and 30 angstroms.

30. The structure of claim 21 wherein the layer that refills the etched-out region is a layer of the ferromagnetic material NiFe.

31. The structure of claim 21 wherein the longitudinally biasing layer is a layer of the antiferromagnetic material MnNi.

32. The structure of claim 21 wherein the longitudinally biasing layer is a layer of the antiferromagnetic material MnPt.

33. The structure of claim 21 wherein the longitudinally biasing layer is a layer of the antiferromagnetic material IrMn.

34. The structure of claim 21 wherein the longitudinally biasing layer is a layer of the hard magnetic material CoPt.

35. The structure of claim 21 wherein the longitudinally biasing layer is a layer of the hard magnetic material CoPtCr.

36. The structure of claim 21 wherein the conductor lead layer is a layer of Ta (50–100 angstroms)/Au (400–500 angstroms)/Ta (50–100 angstroms) which is aligned and deposited on the longitudinally biasing layer.

37. The structure of claim 21 wherein the upper substrate layer is a layer of aluminum oxide deposited to a thickness of between 350 angstroms and 500 angstroms.

* * * * *